United States Patent
Okamoto

(10) Patent No.: US 6,908,338 B2
(45) Date of Patent: Jun. 21, 2005

(54) HOUSING OF ELECTRONIC APPARATUS

(75) Inventor: Shinya Okamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/793,963

(22) Filed: Mar. 8, 2004

(65) Prior Publication Data

US 2004/0192112 A1 Sep. 30, 2004

(30) Foreign Application Priority Data

Mar. 27, 2003 (JP) ........................................ 2003-089345

(51) Int. Cl.$^7$ .......................................... H01R 13/648
(52) U.S. Cl. ..................................................... 439/607
(58) Field of Search ............................... 439/607, 608, 439/108, 845; 361/818, 816, 752, 800; 455/90, 300; 174/35 R

(56) References Cited

U.S. PATENT DOCUMENTS

| 4,759,466 | A | | 7/1988 | Chase et al. |
|---|---|---|---|---|
| 5,285,350 | A | * | 2/1994 | Villaume ..................... 361/690 |
| 5,348,549 | A | * | 9/1994 | Brown et al. ............... 604/403 |
| 5,383,098 | A | * | 1/1995 | Ma et al. ..................... 361/818 |
| 5,420,760 | A | * | 5/1995 | Ansell et al. ............... 361/818 |
| 5,691,503 | A | * | 11/1997 | Kato ........................ 174/35 R |
| 5,777,854 | A | | 7/1998 | Welch et al. |
| 6,232,550 | B1 | | 5/2001 | Mangold |
| 6,483,719 | B1 | * | 11/2002 | Bachman ..................... 361/816 |
| 6,661,677 | B1 | * | 12/2003 | Rumney ..................... 361/818 |
| 6,780,053 | B1 | * | 8/2004 | Yunker et al. .............. 439/607 |

FOREIGN PATENT DOCUMENTS

| DE | 199 42 949 C1 | 8/2001 |
|---|---|---|
| EP | 1 276 363 A1 | 1/2003 |
| EP | 1 311 148 A2 | 5/2003 |
| JP | 1-204499 A | 8/1989 |
| JP | 2000-165713 A | 6/2000 |

* cited by examiner

Primary Examiner—Alexander Gilman
(74) Attorney, Agent, or Firm—Foley & Lardner LLP

(57) ABSTRACT

A housing of an electronic apparatus includes a first housing section having a box shape and an opening on a plane, and a second housing section which closes the opening. The first and second housing sections are made of plate members with a coated surface and a non-coated surface, and the coated surface is used for an outer surface and the non-coated surface is used for an inner surface. The first housing section includes a vertical side wall, and a horizontal contact section extending from a top edge of the vertical side wall in a horizontal direction and having a folded section formed by folding a portion of the horizontal contact section to form the non-coated surface as a part of an upper surface of the horizontal contact section. The horizontal contact section includes a plurality of contact portions which are contact with the inner surface of the second housing section for shielding electromagnetic wave.

8 Claims, 5 Drawing Sheets

HOUSING OF ELECTRONIC APPARATUS

BACKGROUND OF THE INVENTION

1. Field of the Invention

The present invention relates to a housing of an electronic apparatus such as a personal computer.

2. Description of the Related Art

A housing of an electronic apparatus is required to prevent leakage of electromagnetic wave generated by an electronic circuit inside the housing. In this case, coupling portions of a plurality of plate-shaped members of the housing must be electrically contacted.

Typically, coated plate-shaped members such as a coated steel sheet are assembled for the housing of the electronic apparatus. However, the coated section can not be electrically contacted. Therefore, in a conventional housing, in order to secure non-coated coupling portions of the plate-shaped members, when the plate-shaped member is coated, the coupling portion is masked such that the coating material is not deposited on the coupling portion. Otherwise, an uncoated member is separately prepared and is coupled to the coated coupling portion.

FIG. 1 is a perspective view showing a part of the housing of the conventional electronic apparatus, and FIG. 2 is an exploded view of the portion shown in FIG. 1. Also, FIG. 3 is a perspective showing a part of a first exterior section of the housing of the conventional electronic apparatus. As shown in FIG. 1, the housing of the conventional electronic apparatus is composed of a first exterior section 101 of a box shape and a second exterior section 102. An opening is formed in the first exterior section so as to allow the electronic apparatus to be inserted, accommodated and removed. The second exterior section 102 closes the opening of the first exterior section 101.

As shown in FIG. 3, in the first exterior section 101 of the housing of the conventional electronic apparatus, an edge portion on the attachment side of the second exterior section 102 is bent into the direction of inside of the housing to form a horizontal section 101a. The horizontal section 101a is bent downwardly to form a vertical section 101b, and then bent in a horizontal direction to form a horizontal section 101c. A plurality of grooves 103 are formed in a bent portion from which the horizontal section 101c extends in the horizontal direction, such that each of the grooves 103 is narrower at an end and wider at the other end. Also, a plurality of contact sections 105 are formed on the end edge portion of the horizontal section 101c such that the contact section 105 is located in an upper portion than the horizontal section 101c. A protrusion portion 104 for electromagnetic wave shielding is placed on a tip of each contact section 105 to have a shape of a button. The outer surface of this first exterior section 101 is coated such that a portion of the horizontal section 101c where the grooves 103 are formed is coated but a portion of the horizontal section 101c where the contact sections 105 are formed is not coated. In FIG. 3, this coated portion is hatched.

As shown in FIG. 2, a plurality of protrusion sections 106 are formed on an edge portion of the second exterior section 102 to extend downwardly such that protrusion sections 106 are inserted into the grooves 103 of the first exterior section 101. The outer surface of the second exterior section 102 is coated but the inner surface thereof is not coated.

As shown in FIG. 4, the protrusion sections 106 are inserted into the grooves 103 and then the second exterior section 102 is slid into a direction of the narrow portion of the grooves 103. Thus, the protrusion sections 106 are fitted into the grooves 103, and the second exterior section 102 is engaged with the first exterior section 101. At this time, since the protrusion 104 is protruded upwardly than the horizontal section 101c, the protrusion 104 is brought into contact with the inner surface of the second exterior section 102. Since the inner surface of the second exterior section 102 is not coated, the first and second exterior sections 101 and 102 are brought into electric contact with each other.

Also, an imaging apparatus is described in Japanese Laid Open Patent Application (JP-P2000-165713A). In this first conventional example, when a non-conductive layer is formed over an inner surface of a housing, conductive protrusions break the non-conductive layer to contact a conductive layer of the housing.

However, in the housing of the conventional electronic apparatus, when the first exterior section 101 is coated, the contact section 105 needs to be masked such that coating material is not deposited. An uncoated member is prepared and must be coupled by welding and the like. Thus, the manufacturing step and the manufacturing cost are increased. Also, in the first exterior section 101, corrosion is easily induced in the coupling portion. On the other hand, in the first conventional example, a problem of reliability that unless the conductive protrusion placed on the contact section penetrates the non-conductive layer and reaches the conductive layer, it is not brought into the electrical contact.

In conjunction with the above description, a plastic cover is described in Japanese Laid Open Patent Application (JP-A-Heisei 1-204499). In this conventional example, an electronic apparatus has a plastic cover on which an electric conductive film is coated and grounded. A terminal with a hole is fixed to a protrusion provided on a surface to be coated. The electric conductive film is coated on the surface including the terminal. The terminal is connected to a ground potential member of the apparatus by a wire.

SUMMARY OF THE INVENTION

Therefore, an object of the present invention is to provide a housing of an electronic apparatus, which does not require an addition of other members, a coating operation accompanying a masking operation, and a complex process.

In an aspect of the present invention, a housing of an electronic apparatus includes a first housing section having a box shape and an opening on a plane, and a second housing section which closes the opening. The first and second housing sections are made of plate members with a coated surface and a non-coated surface, and the coated surface is used for an outer surface and the non-coated surface is used for an inner surface. The first housing section includes a vertical side wall, and a horizontal contact section extending from a top edge of the vertical side wall in a horizontal direction and having a folded section formed by folding a portion of the horizontal contact section to form the non-coated surface as a part of an upper surface of the horizontal contact section. The horizontal contact section includes a plurality of contact portions which are contact with the inner surface of the second housing section for shielding electromagnetic wave.

Here, the horizontal contact section may be formed by bending the vertical side wall in an inside direction of the first housing section. In this case, the first housing section may include a plurality of longitudinal grooves in the bending portion, and the second housing section may include a plurality of downwardly extending portions such that the second housing section is engaged with the first housing section by inserting plurality of downwardly extending portions into the plurality of longitudinal grooves and then moving the second housing section in a longitudinal direction of the longitudinal groove. Each of the plurality of downwardly extending portions has a smaller width at a proximal and larger width at a tip.

Also, the horizontal contact section may include a horizontal extending section formed by bending the plate member at the top edge of the vertical side wall in the horizontal direction; and the folded section. In this case, the folded section may include the plurality of contact portions formed by notches, each of which extends in a direction perpendicular to a plane of the vertical side wall and then a direction parallel to the plane of the vertical side wall. Also, the horizontal extending section may include a plurality of holes, each of which is provided for one of the plurality of contact portions.

Also, the second housing section may further include a plurality of contact protrusions, each of which is provided for one of the plurality of contact portions.

DESCRIPTION OF THE PREFERRED EMBODIMENT

A housing of an electronic apparatus of the present invention will be described below with reference to the attached drawings.

Figure 1:
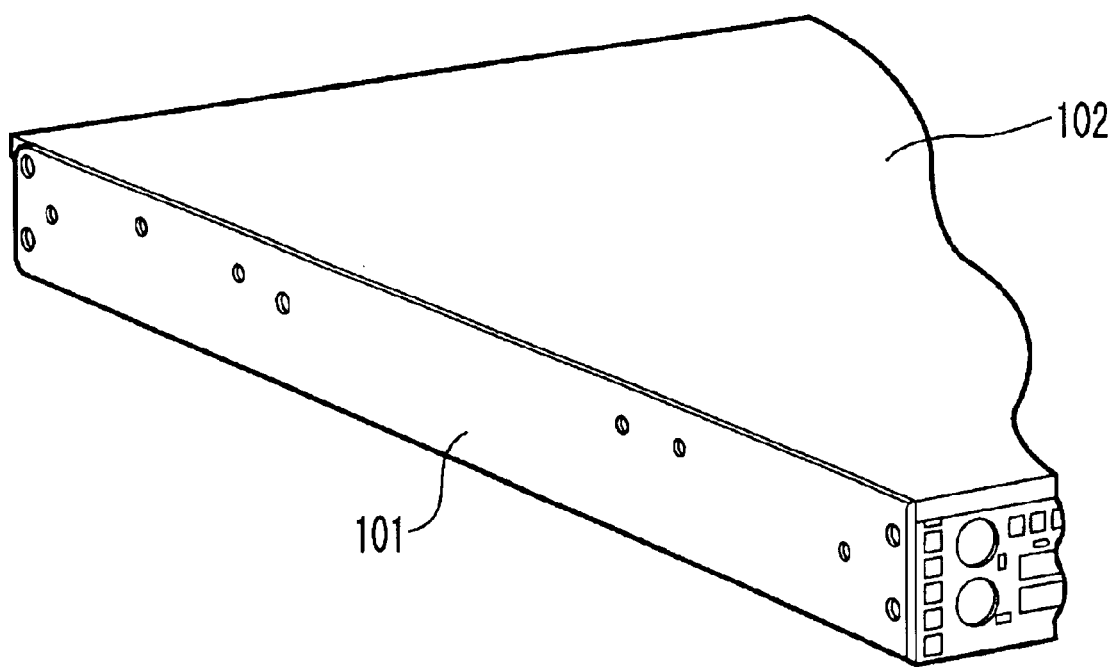
FIG. 1 is a perspective view showing a portion of a housing of a conventional electronic apparatus.
Figure 2:
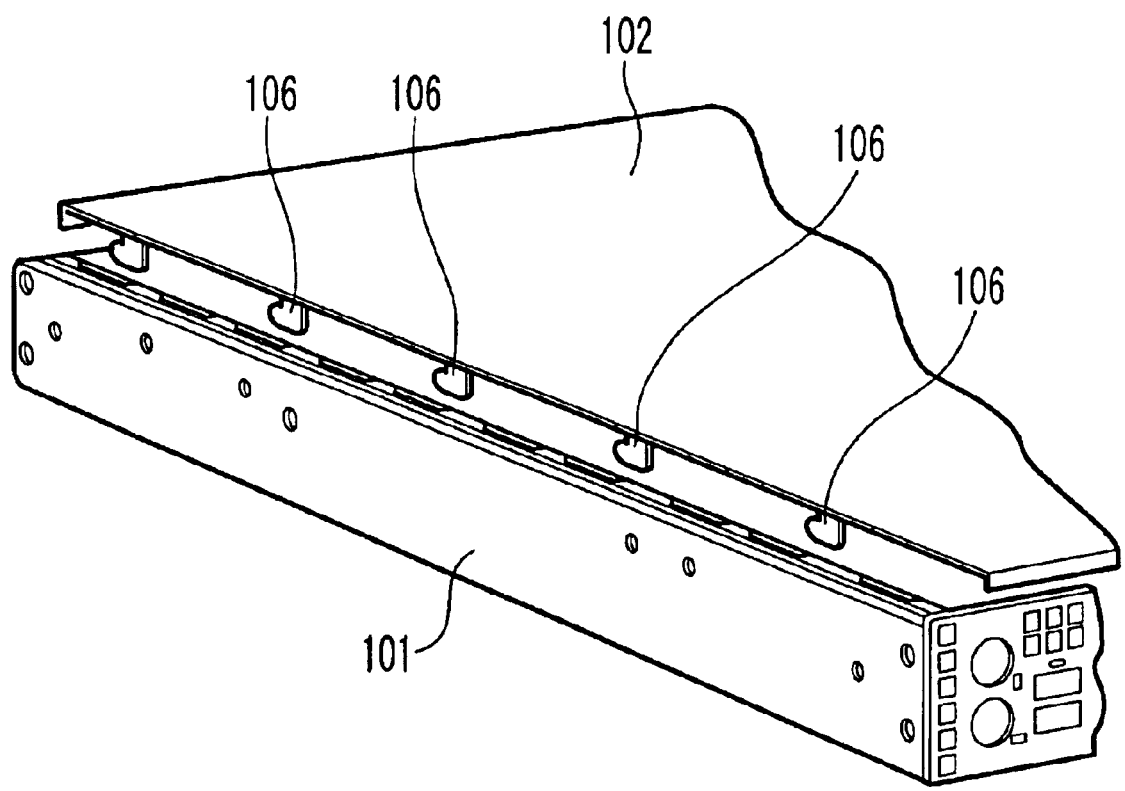
FIG. 2 is an exploded perspective view showing the portion of the housing of the conventional electronic apparatus shown in FIG. 1.
Figure 3:
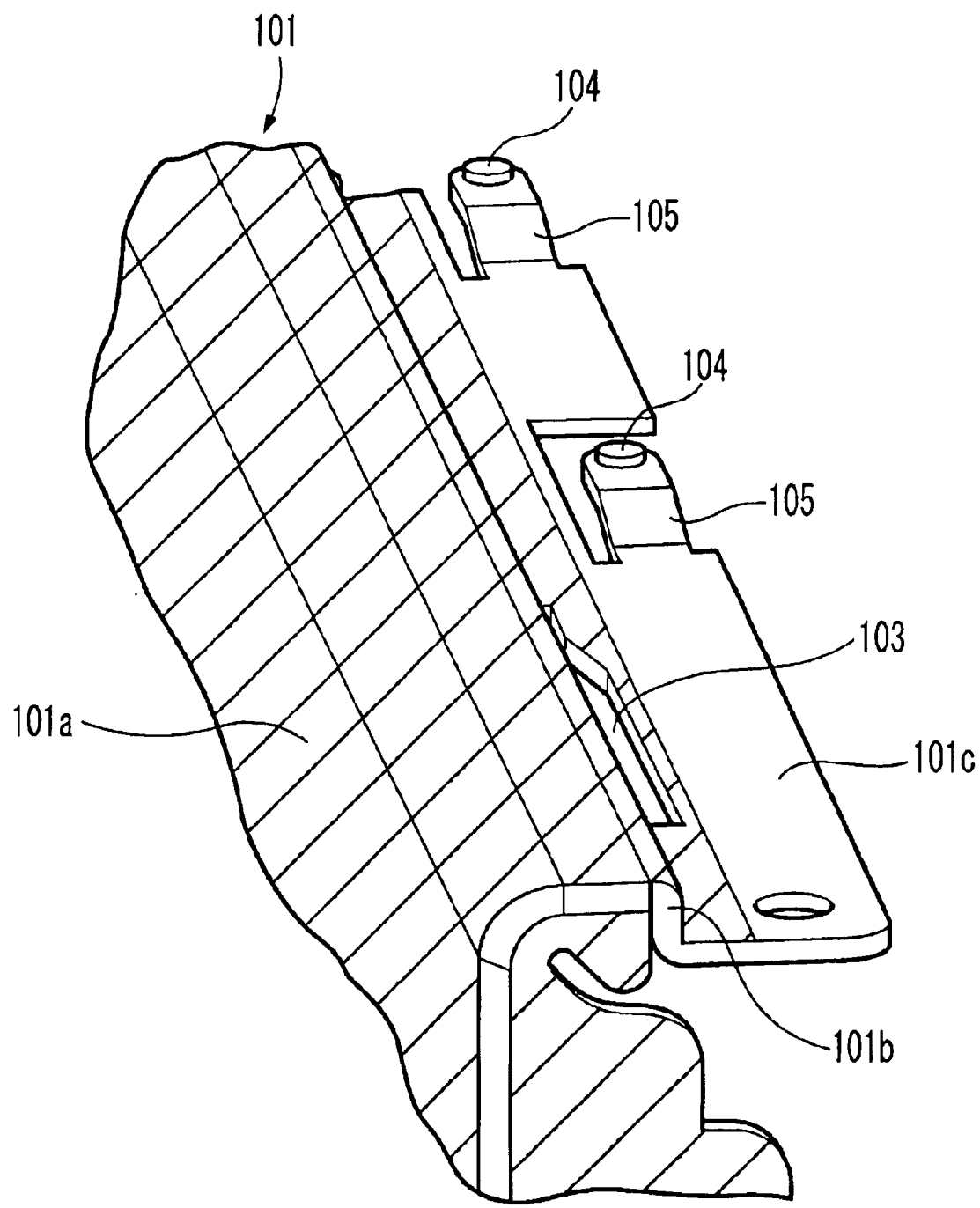
FIG. 3 is a perspective view showing a portion of a first exterior section of the housing of the conventional electronic apparatus.
Figure 4:
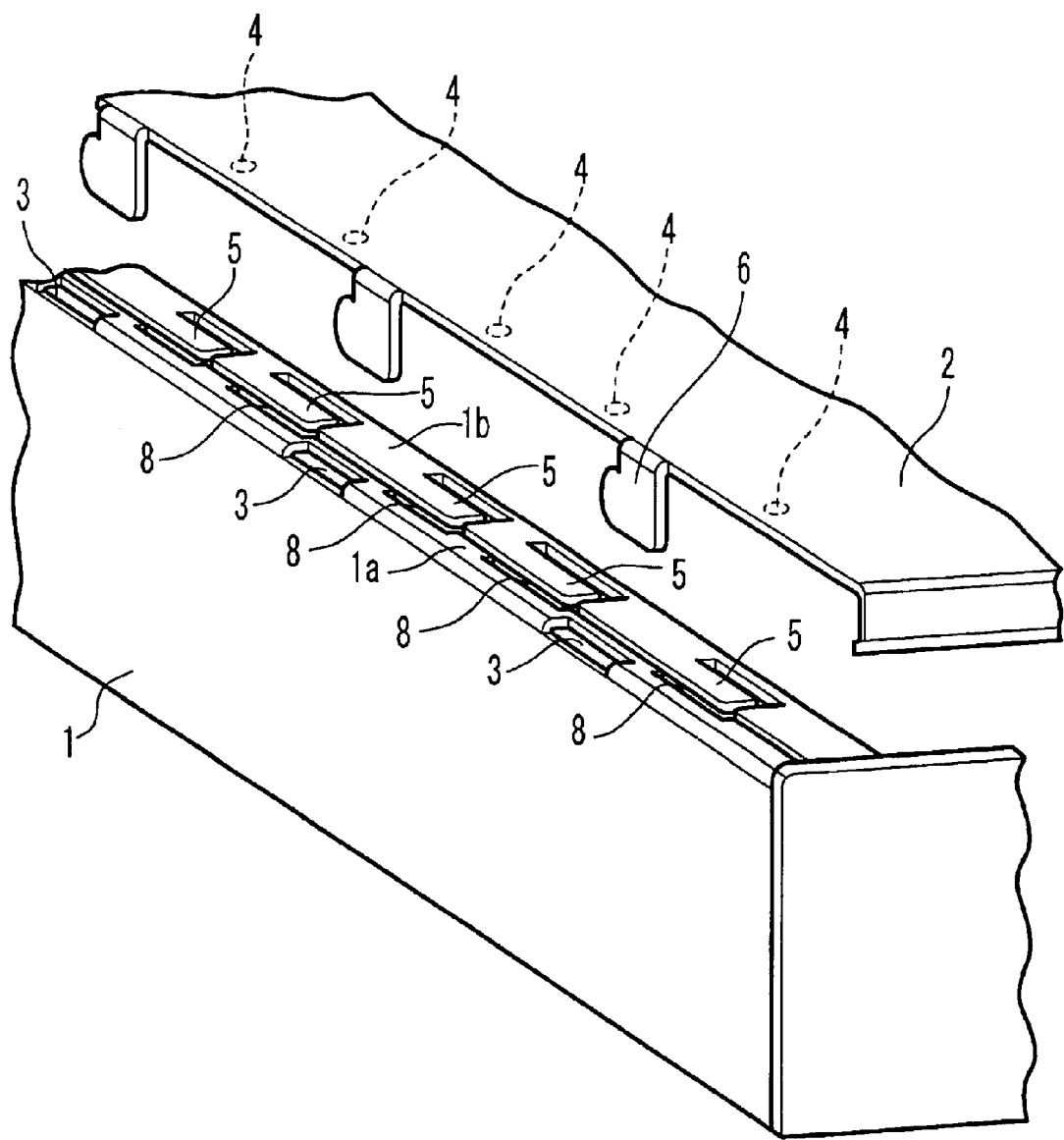
FIG. 4 is an exploded perspective view showing a portion of a housing of an electronic apparatus according to an embodiment of the present invention.

FIG. 4 is an exploded perspective view showing a portion of the housing of the electronic apparatus according to an embodiment of the present invention. As shown in FIG. 4, the housing of the electronic apparatus according to this embodiment is composed of a first housing section 1 of a box shape, and a second housing section 2. The first housing section 1 has an opening on a plane so as to allow the electronic apparatus to be inserted, accommodated and removed. The second housing section 2 closes the opening of the first housing section 1. Each of the first housing section 1 and the second housing section 2 is made of a coated steel sheet, in which one surface is coated and the other surface is not coated. The coated surface serves as an outer surface, and the non-coded surface serves as an inner surface.

The first housing section 1 is composed of four side walls and a bottom plate. The first housing section 1 has contact sections provided for two side walls opposing to each other. Each of the contact sections extends from an upper edge of the corresponding side wall into a horizontal direction toward the inside of the box of the first housing section 1. The contact section is formed by bending an upwardly extending portion in a direction perpendicular to the side wall. The contact section is composed of a horizontal extending section 1a and a folded section 1b. The folded section 1b is formed by folding the horizontal extending section 1a. Thus, an upper surface of the folded section 1b has the non-coated surface. The tip of the folded section 1b does not reach the bending portion of the vertical side wall.

A plurality of longitudinal grooves 3 are formed in the bending portion of the vertical side wall along the side wall. The longitudinal direction of the longitudinal groove 3 is parallel to the upper edge of the side wall.

A plurality of notches are formed in the folded section 1b. The notch extends from the tip portion of the folded section 1b toward the inside of the box of the first housing section 1 and then extends in a direction parallel to the upper edge of the side wall. Thus, a plurality of contact sections 5 are formed by the notches. Each contact section 5 is elastically deformable. A plurality of holes 8 are formed in a portion of the horizontal extending section 1a for the plurality of contact sections 5, respectively. The size of the hole is desirably larger than the contact section 5 so that the contact section 5 can be elastically deformed downwardly.

A plurality of L-shaped protrusion sections 6 are extending from the edge of the second housing section 2 corresponding to the side wall of the first housing section 1. The protrusion section 6 has a smaller width at a proximal section and a larger width at a tip section. In the housing of the electronic apparatus in this embodiment and is inserted into the groove 3, a plurality of contact protrusions 4 are provided for the inner surface of the second housing section 2 in correspondence to the contact sections 5. The contact protrusions 4 can be formed by using a pressing process and the like, when the second housing section 2 is formed. When the first and second housing sections 1 and 2 are assembled, the contact protrusions 4 contact the contact sections 5 to electrically connect the first and second housing sections 1 and 2. Thus, electromagnetic wave shielding effect is achieved.

The operation of the housing of the electronic apparatus in this embodiment will be described below. In the housing of the electronic apparatus in this embodiment, the protrusion sections 6 extending from the edge of the second housing section 2 are inserted into the grooves 3 formed in the first housing section 1 and then the second housing section 2 is slid into an extending direction of the groove 3. Thus, the protrusion section 6 is fitted into the groove 3, and the second housing section 2 is engaged with the first housing section 1. At this time, the contact protrusions 4 formed on the inner surface of the second housing section 2 are contact with the contact section 5 formed in the folded section 1b of the first housing section 1. Thus, the first and second housing sections 1 and 2 are electrically connected with each other, since the lower surface of the contact protrusion 4 and the upper surface of the contact section 5 are not coated. Also, the hole 8 is formed below the contact section 5. Thus, when the contact section 5 is pushed by the contact protrusion 4, the contact section 5 can be downwardly bent sufficient. Consequently, the contact between the contact protrusion 4 and the contact section 5 can be kept.

In this embodiment, the edge portion of the side wall of the first housing section 1 is bent and folded so that the non-coated surface serves as the outer surface, and the contact sections 5 are formed in the folded section 1b so that the contact sections 5 are contact with the contact protrusions 4 provided on the inner surface of the first housing section 1. Thus, the first and second housing sections 1 and 2 can be electrically connected without any addition of a non-coated different member and any coating operation requiring the masking. Also, the shapes of the contact protrusion 4 and the contact section 5 are simple in this embodiment. Thus, the processing is easy as compared with the housing of the conventional electronic apparatus.

Figure 5:
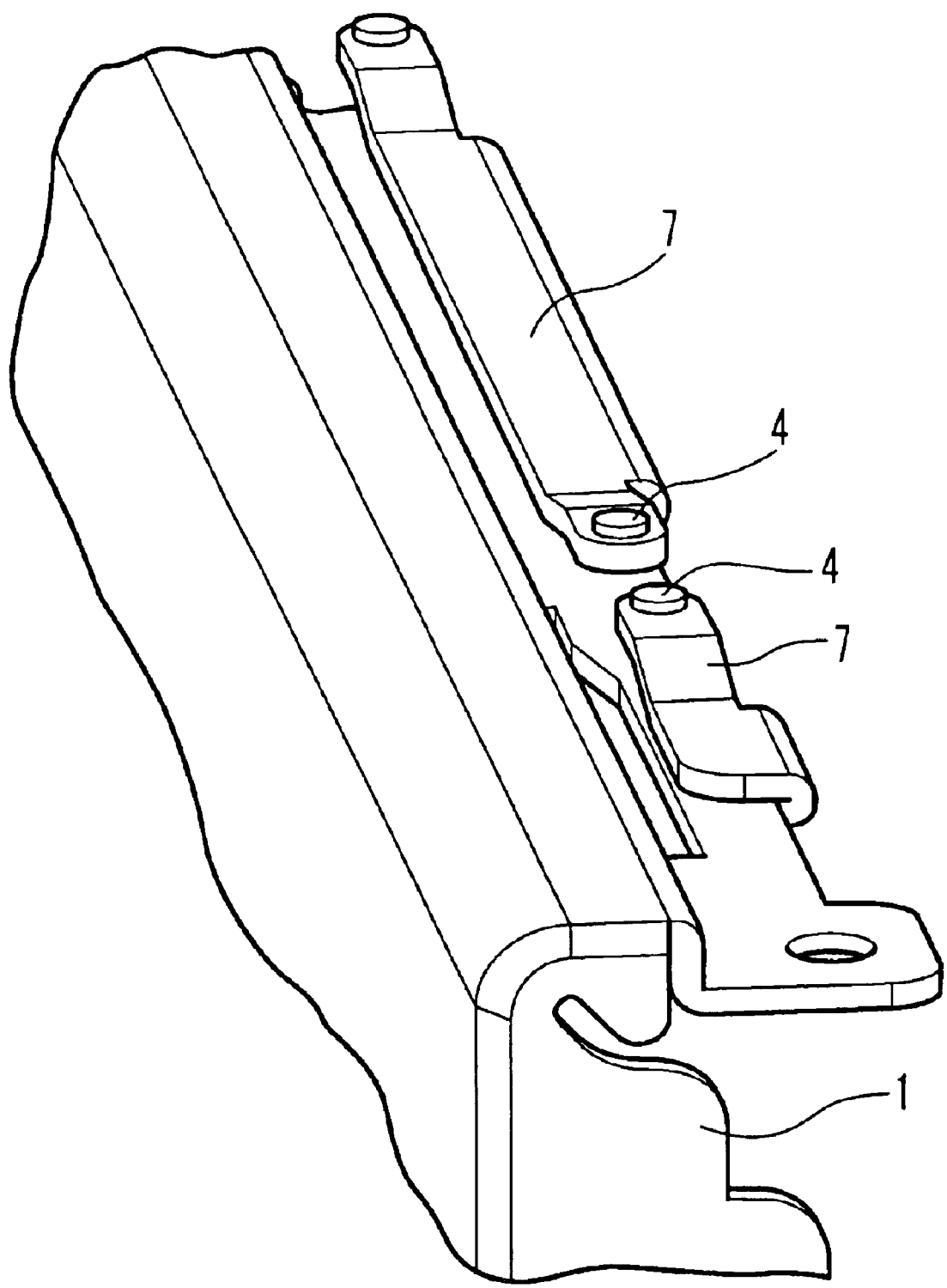
FIG. 5 is a perspective view showing a portion of a first exterior section.

It should be noted that it is possible to bring the first and second housing sections into the electrical contact with each other by forming the contact protrusion for electromagnetic wave shielding on the contact section and bringing this contact protrusion into contact with the inner surface of the second housing section. However, in this case, the processing of the contact section becomes complex. FIG. 5 is a perspective view showing a portion of a first housing section where the contact protrusion is formed on the contact section. As shown in FIG. 5, when the contact protrusion 4 is formed on the contact section 7 in a first housing section 1, the shape of the contact section 7 is complex as compared with the contact section 5 on the housing of the electronic apparatus in this embodiment. Thus, there may be a case that its manufacturing step and manufacturing cost are increased.

What is claimed is:

1. A housing of an electronic apparatus, comprising:

a first housing section having a box shape and an opening on a plane; and a second housing section which closes said opening, wherein said first and second housing sections are made of plate members with a coated surface and a non-coated surface, and the coated surface is used for an outer surface and the non-coated surface is used for an inner surface, said first housing section comprises:

a vertical side wall; and a horizontal contact section extending from a top edge of said vertical side wall in a horizontal direction and having a folded section formed by folding a portion of said horizontal contact section to form the non-coated surface as a part of an upper surface of said horizontal contact section, and said horizontal contact section comprises a plurality of contact portions which are contact with the inner surface of said second housing section for shielding electromagnetic wave.

2. The housing according to claim 1, wherein said second housing section further comprises a plurality of contact protrusions, each of which is provided for one of said plurality of contact portions.

3. The housing according to claim 1, wherein said horizontal contact section is formed by bending said vertical side wall in an inside direction of said first housing section.

4. The housing according to claim 3, wherein said first housing section comprises a plurality of longitudinal grooves in the bending portion, and said second housing section comprises a plurality of downwardly extending portions such that said second housing section is engaged with said first housing section by inserting plurality of downwardly extending portions into said plurality of longitudinal grooves and then moving said second housing section in a longitudinal direction of said longitudinal groove.

5. The housing according to claim 4, wherein each of said plurality of downwardly extending portions has a smaller width at a proximal and larger width at a tip.

6. The housing according to claim 1, wherein said horizontal contact section comprises:

a horizontal extending section formed by bending said plate member at said top edge of said vertical side wall in the horizontal direction; and said folded section.

7. The housing according to claim 6, wherein said folded section comprises said plurality of contact portions formed by notches, each of which extends in a direction perpendicular to a plane of said vertical side wall and then a direction parallel to the plane of said vertical side wall.

8. The housing according to claim 7, wherein said horizontal extending section comprises a plurality of holes, each of which is provided for one of said plurality of contact portions.

* * * * *